United States Patent
Jeong et al.

(10) Patent No.: US 8,319,234 B2
(45) Date of Patent: Nov. 27, 2012

(54) ORGANIC LIGHT EMITTING DIODE DISPLAY HAVING A MULTI-COLOR PIXEL INCLUDING A HYDROPHOBIC LAYER

(75) Inventors: Beung-Hwa Jeong, Yongin (KR); Kwang-Nam Kim, Yongin (KR); Young-Ro Jung, Yongin (KR); Yun-Sik Ham, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/067,027

(22) Filed: May 3, 2011

(65) Prior Publication Data

US 2012/0001206 A1     Jan. 5, 2012

(30) Foreign Application Priority Data

Jul. 2, 2010   (KR) .................. 10-2010-0063962

(51) Int. Cl.
| | |
|---|---|
| H01L 29/20 | (2006.01) |
| H01L 33/00 | (2010.01) |
| H01L 29/201 | (2006.01) |
| H01L 29/04 | (2006.01) |
| H01L 29/15 | (2006.01) |
| H01L 31/036 | (2006.01) |
| H01L 29/08 | (2006.01) |
| H01L 35/24 | (2006.01) |
| H01L 51/00 | (2006.01) |
| H01L 29/10 | (2006.01) |
| H01L 31/0376 | (2006.01) |
| H01L 31/20 | (2006.01) |
| H01L 31/00 | (2006.01) |

(52) U.S. Cl. ............... 257/89; 257/40; 257/59; 257/72; 257/90; 257/440; 257/E51.022

(58) Field of Classification Search .............. 257/40, 257/59, 72, 89, 90, 440, E51.022
See application file for complete search history.

(56) References Cited

U.S. PATENT DOCUMENTS

| | | | | |
|---|---|---|---|---|
| 6,878,470 | B2 * | 4/2005 | Kawamura et al. | 428/690 |
| 7,399,993 | B2 * | 7/2008 | Matsuda | 257/89 |
| 7,601,988 | B2 * | 10/2009 | Seo et al. | 257/88 |
| 7,709,833 | B2 * | 5/2010 | Matsuda | 257/40 |
| 8,183,564 | B2 * | 5/2012 | Takaya | 257/40 |
| 8,203,158 | B2 * | 6/2012 | Yoshida et al. | 257/89 |
| 2006/0105201 | A1 * | 5/2006 | Lee et al. | 428/690 |
| 2006/0181203 | A1 * | 8/2006 | Meng et al. | 313/506 |

FOREIGN PATENT DOCUMENTS

| | | |
|---|---|---|
| KR | 10-2006-0094867 A | 8/2006 |
| KR | 10-0646974 B1 | 11/2006 |

* cited by examiner

Primary Examiner — Ida M Soward
(74) Attorney, Agent, or Firm — Lee & Morse, P.C.

(57) ABSTRACT

An organic light emitting diode display and a fabrication method thereof, the display including a substrate; a thin film transistor on the substrate; and an organic light emitting diode on the substrate, the organic light emitting diode including a pixel electrode, an organic emission layer, and a common electrode, wherein the organic emission layer includes a red (R) pixel, a green (G) pixel, and a blue (B) pixel, the pixel electrode includes a first pixel electrode, a second pixel electrode, and a third pixel electrode that respectively correspond to the red pixel, the green pixel, and the blue pixel, the first pixel electrode, the second pixel electrode, and the third pixel electrode each have different thicknesses, and the first pixel electrode, the second pixel electrode, and the third pixel electrode each include a first hydrophobic layer.

12 Claims, 6 Drawing Sheets

ORGANIC LIGHT EMITTING DIODE DISPLAY HAVING A MULTI-COLOR PIXEL INCLUDING A HYDROPHOBIC LAYER

BACKGROUND

1. Field

Embodiments relate to an organic light emitting diode display and a fabricating method thereof.

2. Description of the Related Art

An organic light emitting diode (OLED) display is a flat panel display that may be lightweight and thin, may exhibit a self-luminous characteristic, and may not require a separate light source. The OLED display may exhibit quality characteristics, e.g., low power consumption, high luminance, and high response speed, and as such, the OLED display is receiving much attention as a next-generation display device.

An organic light emitting diode display may include an organic light emitting diode including an anode, an organic emission layer, and a cathode. Holes and electrons may be injected from the anode and the cathode, respectively, to form excitons. The excitons may transition to a ground state, thereby causing the organic light emitting diode to emit light.

A lifespan of such an organic light emitting diode may be limited. For example, the lifespan of the organic light emitting diode may be affected by degradation of organic materials, interfacial characteristics of organic materials, and so on. A method for improving interfacial characteristics by forming a buffer layer under each pixel in order to improve the lifespan of an organic light emitting diode has been proposed.

For example, the organic light emitting diode may include a red pixel (R), a green pixel (G), and a blue pixel (B); and the lifespan varies from pixel to pixel. To compensate for differences in lifespan among pixels, each pixel may include a buffer layer formed thereunder. For example, thickness of the respective buffer layers may differ from pixel to pixel.

The above information disclosed in this Background section is only for enhancement of understanding of the background of the invention and therefore it may contain information that does not form the prior art that is already known in this country to a person of ordinary skill in the art.

SUMMARY

Embodiments are directed to an organic light emitting diode display and a fabricating method thereof.

At least one of the above and other features and advantages may be realized by providing an organic light emitting diode display including a substrate; a thin film transistor on the substrate; and an organic light emitting diode on the substrate, the organic light emitting diode including a pixel electrode, an organic emission layer, and a common electrode, wherein the organic emission layer includes a red (R) pixel, a green (G) pixel, and a blue (B) pixel, the pixel electrode includes a first pixel electrode, a second pixel electrode, and a third pixel electrode that respectively correspond to the red pixel, the green pixel, and the blue pixel, the first pixel electrode, the second pixel electrode, and the third pixel electrode each have different thicknesses, and the first pixel electrode, the second pixel electrode, and the third pixel electrode each include a first hydrophobic layer.

A thickness of the first pixel electrode may be greater than a thickness of the second pixel electrode, and a thickness of the second pixel electrode may be greater than a thickness of the third pixel electrode.

The first pixel electrode may include a sequentially stacked first ITO (indium tin oxide) layer, Ag (silver) layer, second ITO layer, third ITO layer, and fourth ITO layer, the first hydrophobic layer may be between the second ITO layer and the third ITO layer, and the first pixel electrode may further include a second hydrophobic layer, the second hydrophobic layer being between the third ITO layer and the fourth ITO layer.

The first ITO layer, the second ITO layer, and the third ITO layer may each include polycrystalline ITO.

The second pixel electrode may include a sequentially stacked first ITO layer, Ag layer, second ITO layer, and third ITO layer, and the first hydrophobic layer may be between the second ITO layer and the third ITO layer.

The second pixel electrode may further include a second hydrophobic layer, the second hydrophobic layer being on the third ITO layer.

The first ITO layer, the second ITO layer, and the third ITO layer may each include polycrystalline ITO.

The third pixel electrode may include a sequentially stacked first ITO layer, Ag layer, and second ITO layer, and the first hydrophobic layer may be on the second ITO layer.

The first ITO layer and the second ITO layer may each include polycrystalline ITO.

The first hydrophobic layer may have a thickness of about 30 Å to about 50 Å.

The organic emission layer may further include at least one of a hole injection layer, a hole transporting layer, an electron transporting layer, and an electron injection layer.

The organic light emitting diode display may further include a reflective layer on the common electrode.

At least one of the above and other features and advantages may also be realized by providing a fabricating method of an organic light emitting diode display, the method including providing a substrate; forming a thin film transistor on the substrate; forming a pixel electrode on the thin film transistor; forming an organic emission layer on the pixel electrode; and forming a common electrode on the organic emission layer, wherein the pixel electrode includes a first hydrophobic layer and a second hydrophobic layer, and thicknesses of portions of the pixel electrode corresponding to a red pixel, a green pixel, and a blue pixel of the organic emission layer, respectively, are different from each other.

Forming the pixel electrode may include forming a first pixel electrode, a second pixel electrode, and a third pixel electrode under each of and corresponding to the red pixel, the green pixel, and the blue pixel, respectively, a thickness of the first pixel electrode may be greater than a thickness of the second pixel electrode, and a thickness of the second pixel electrode may be greater than a thickness of the third pixel electrode.

Forming the pixel electrode may include sequentially stacking a first ITO layer, a Ag layer, and a second ITO layer; forming the first hydrophobic layer on the second ITO layer; forming a third ITO layer on the first hydrophobic layer; removing a part of the third ITO layer; forming the second hydrophobic layer on the third ITO layer; forming a fourth ITO layer on the second hydrophobic layer; and removing a part of the fourth ITO layer.

Forming the pixel electrode may further include polycrystallizing the first ITO layer and the second ITO layer prior to forming the first hydrophobic layer.

Polycrystallizing the first ITO layer and the second ITO layer may include a heat treatment.

Removing the part of the third ITO layer may include forming a photoresist layer on portions of the third ITO layer corresponding to the red pixel and the green pixel; etching portions of the third ITO layer corresponding to the blue pixel; and removing the photoresist layer.

Forming the pixel electrode may further include polycrystallizing the third ITO layer prior to forming the second hydrophobic layer.

Polycrystallizing the third ITO layer may include a heat treatment.

Removing the part of the fourth ITO layer may include forming a photoresist layer on a portion of the fourth ITO layer corresponding to the red pixel; etching portions of the fourth ITO layer corresponding to the green pixel and the blue pixel; and removing the photoresist layer.

The first hydrophobic layer and the second hydrophobic layer may each have a thickness of about 30 Å to about 50 Å.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
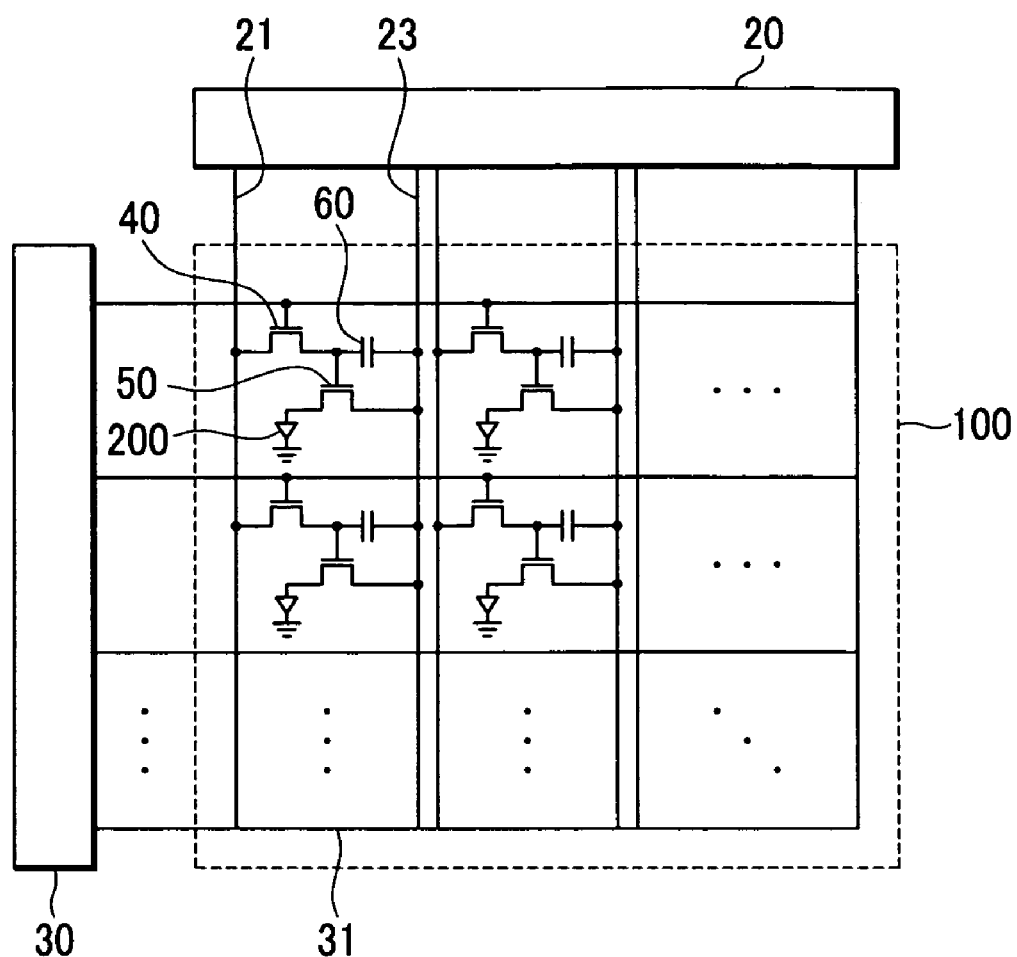
FIG. 1 illustrates a block diagram schematically showing an organic light emitting diode display according to an embodiment.

Korean Patent Application No. 10-2010-0063962, filed on Jul. 2, 2010, in the Korean Intellectual Property Office, and entitled: "Organic Light Emitting Diode Display And Fabricating Method Thereof," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
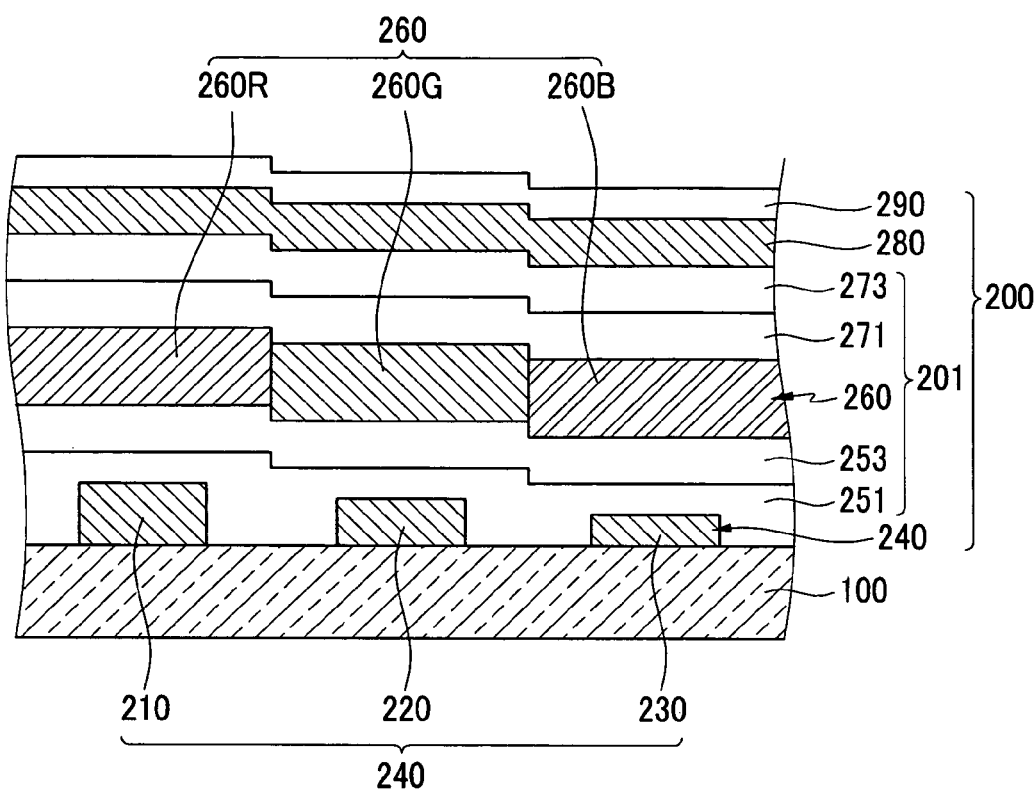
FIG. 2 illustrates a cross-sectional view showing an internal configuration of the organic light emitting diode display of FIG. 1.

FIG. 1 illustrates a block diagram schematically showing an organic light emitting diode display according to an embodiment. FIG. 2 illustrates a cross-sectional view showing an internal configuration of the organic light emitting diode display of FIG. 1.

Referring to FIG. 1, the organic light emitting diode according to the present embodiment may include a plurality of gate lines 31, a plurality of data lines 21 intersecting the plurality of gate lines 31 and insulated therefrom, and a common voltage line 23 formed parallel to the data lines 21, on a display substrate 100. The gate lines 31 and the data lines 21 may respectively generate a gate voltage and a data voltage, and may be connected to a gate driver 30 and a data driver 20 that provide these voltages. The common voltage line 23 may also be connected to the data driver 20.

A plurality of pixels may be formed in a matrix at areas where the plurality of gate lines 31 and the plurality of data lines 21 intersect each other. Each pixel may include a switching thin film transistor 40, a driving thin film transistor 50, a capacitor 60, and an organic light emitting diode 200.

The switching thin film transistor 40 may be used as a switching element to select a pixel to emit light, with a switching gate electrode being connected to the gate lines 31 and a switching source electrode and a switching drain electrode being respectively connected to the data lines 31 and the capacitor 60. The driving thin film transistor 50 may cause the organic light emitting diode 200 within the selected pixel to emit light. A driving gate electrode may be connected to the capacitor 60, a driving source electrode may be connected to the common voltage line 23, and a driving drain electrode may be connected to the organic light emitting diode 200.

A voltage corresponding to a voltage difference between a common voltage applied to the driving thin film transistor 50 from the common voltage line 23 and the data voltage transmitted from the switching thin film transistor 40 may be stored in the capacitor 60. A current corresponding to the voltage stored in the capacitor 60 may flow to the organic light emitting diode 200 through the driving thin film transistor 50 so that the organic light emitting diode 200 emits light. The structure of the organic light emitting diode display is merely illustrative, and the embodiments are not limited thereto. Those skilled in the art will appreciate that various modifications of the structure for driving the organic light emitting diode can be made.

Referring to FIG. 2, the organic light emitting diode display according to the present embodiment may include the organic light emitting diode 200 stacked on the display substrate 100 where the switching thin film transistor 40, the driving thin film transistor 50, and the capacitor 60 are formed. Moreover, an encapsulator (not illustrated), e.g., an encapsulation substrate or thin film encapsulation layer, for sealing the organic light emitting diode 200 may be further formed on the organic light emitting diode 200.

The organic light emitting diode 200 may include a pixel electrode 240, an organic emission layer 201 on the pixel electrode, and a common electrode 280 on the organic emission layer 201. Depending upon a driving method of the organic light emitting diode display, the pixel electrode 240 may be an anode and the common electrode 280 may be a cathode, or vice versa. Although the present embodiment has been described with respect to a case where the pixel electrode 240 is an anode and the common electrode 280 is a cathode, the embodiments are not limited thereto.

The pixel electrode 240 may be connected to the driving thin film transistor 50 on the display substrate 100, whereby a voltage for causing the organic emission layer 201 of the organic light emitting diode 200 to emit light may be applied. Each pixel electrode 240 may correspond to each of RGB pixels 260R, 260G, and 260B to be described below. In addition, adjacent pixel electrodes 240 may be spaced apart from each other.

The organic emission layer 201 including, e.g., a low-molecular weight organic material or a high-molecular weight organic material may be formed on the pixel electrode 240. The organic emission layer 201 may include an emission layer 260 including a red pixel 260R, a green pixel 260G, and a blue pixel 260B. The RGB pixels 260R, 260G, and 260B may be formed in such a manner that, as illustrated in FIG. 2, adjacent pixels are continuously formed, or in such a manner that, like the pixel electrode 240, adjacent pixels are spaced apart from each other.

The organic emission layer 201 may further include at least one of a hole injection layer (HIL) 251, a hole transporting layer (HTL) 253, an electron transporting layer (ETL) 271, and an electron injection layer (EIL) 273 in addition to the emission layer 260. If the organic emission layer 201 includes all of the layers, as shown in FIG. 2, the hole injection layer 251 and the hole transporting layer 253 may be formed between the pixel electrode 240 and the emission layer 260; and the electron transporting layer 271 and the electron injection layer 273 may be formed on the emission layer 260 and the common electrode 280.

The common electrode 280 may be formed on the organic emission layer 201 and may cover an entire area of, e.g., the substrate 100, unlike the pixel electrode 240. The common electrode may be formed of, e.g., Al (aluminum), Ag (silver), or a MgAg (magnesium-silver) alloy, and may exhibit excellent conductivity and a high reflection characteristic. In the present embodiment, the organic light emitting diode display may have a bottom emission structure for emitting light in a direction of the display substrate 100. Thus, a reflective layer 290 for reflecting light toward the display substrate 100 may be further included on the common electrode 280. The reflective layer 290 may include a metal, e.g., Al, Ag, or the like, having excellent reflectivity. However, the embodiments are not limited to the bottom emission structure, and the organic light emitting diode display may have a dual emission structure by omitting the reflective layer 290 and forming the common electrode 280 from a transparent electrode material.

As described above, each pixel electrode 240 may correspond to one of the pixels; and adjacent pixel electrodes 240 may be spaced apart from each other. In the present embodiment, referring to FIG. 2, the pixel electrode 240 may include a first pixel electrode 210 under the red pixel 260R, a second pixel electrode 220 under the green pixel 260G, and a third pixel electrode 230 under the blue pixel 260B. The pixel electrodes 210, 220, and 230 corresponding to the respective pixels may each have a differential structure. For example, the first pixel electrode 210, the second pixel electrode 220, and the third pixel electrode 230 may have different thicknesses from each other. Herein, the thickness of a pixel electrode refers to a thickness in a stacking direction of each layer, i.e., in a direction from a bottom of the pixel electrode toward the organic emission layer 201 and the common electrode.

As described above, the thicknesses of the first pixel electrode 210, the second pixel electrode 220, and the third pixel electrode 230 may be different from each other. Accordingly, differences in the lifespan of the pixels may be reduced without an additional buffer layer under the RGB pixels.

Figure 3:
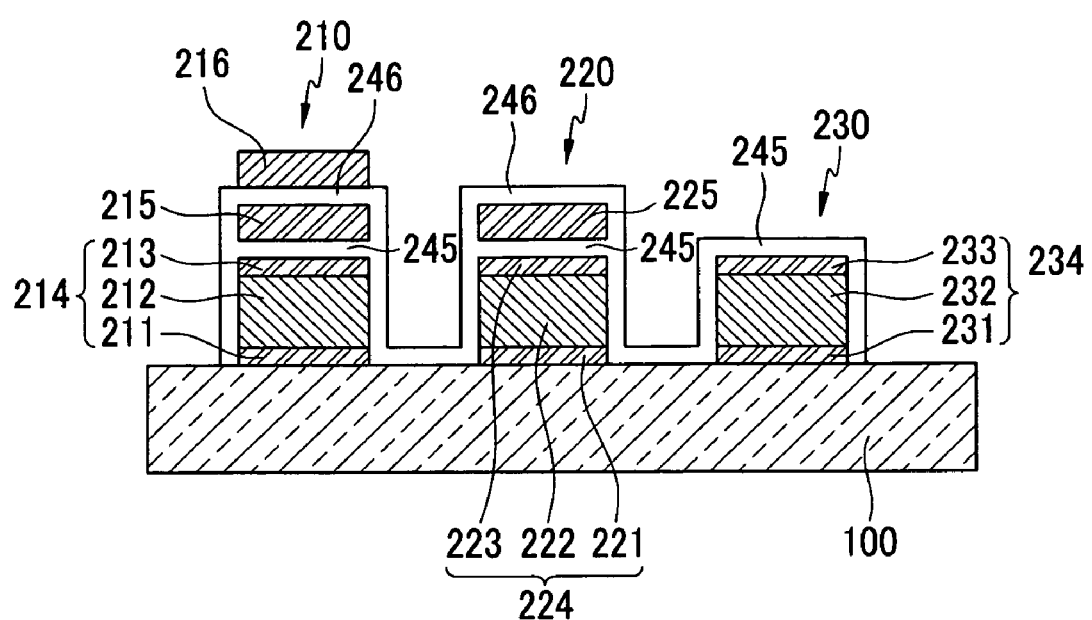
FIG. 3 illustrates an enlarged cross-sectional view of a pixel electrode of the organic light emitting diode display of FIG. 2.

FIG. 3 illustrates an enlarged cross-sectional view of a pixel electrode of the organic light emitting diode display of FIG. 2. Referring to FIG. 3, a structure of the pixel electrode according to the present embodiment will be described in detail.

Referring to FIG. 3, in the organic light emitting diode display according to the present embodiment, the first pixel electrode 210, the second pixel electrode 220, and the third pixel electrode 230 may be formed on the display substrate 100 where, e.g., the driving thin film transistors 50, etc., are formed.

Each of the pixel electrodes 210, 220, and 230 may be formed by stacking an ITO (indium tin oxide) layer and a Ag layer. For example, the pixel electrodes 210, 220, and 230 may respectively include triple-layered films 214, 224, and 234 respectively including first ITO layers 211, 221, and 231, Ag layers 212, 222, and 232, and second ITO layers 213, 223, and 233. In the present embodiment, the first ITO layers 211, 221, and 231 and the second ITO layers 213, 223, and 233 may each have a thickness of about 50 Å to about 500 Å. The Ag layers 212, 222, and 232 may have a thickness of about 50 Å to about 500 Å. The multilayer structure of ITO/Ag/ITO may help ensure that transparent electrodes having excellent conductivity are formed.

A first hydrophobic layer 245 may be formed on the triple-layered films of ITO/Ag/ITO. The first hydrophobic layer 245 may include a thin film having a thickness of about 30 Å to about 50 Å. In an implementation, the hydrophobic layer 245 may be an organic oxide film that is about equal to or thicker than a monomolecular layer.

The first pixel electrode 210 and the second pixel electrode 220 may further include third ITO layers 215 and 225, respectively. The third ITO layers 215 and 225 may be formed on the hydrophobic layer 245; and a second hydrophobic layer 246 may be formed on the third ITO layers 215 and 225. In addition, the first pixel electrode 210 may further include a fourth ITO layer 216 on top of the second hydrophobic layer 246 on the third ITO layer 215. The third ITO layer 215, 225 and the fourth ITO layer 216 may each have a thickness of about 50 Å to about 500 Å. The second hydrophobic layer 246 on the third ITO layers 215 and 225 may be a thin film having a thickness of about 30 Å to about 50 Å. In an implementation, the second hydrophobic layer 246 may be an organic oxide film that is about equal to or thicker than a monomolecular layer.

As described above, the first pixel electrode 210, the second pixel electrode 220, and the third pixel electrode 230 may include the triple-layered films 214, 224, and 234 of ITO/Ag/ITO; and the triple-layered films 214, 224, and 234 may each further include a different number of ITO layers thereon, so the pixel electrodes 210, 220, and 230 have different thicknesses from each other. For example, the first hydrophobic layer 245 and second hydrophobic layer 246, which may be thin films, may be formed on the triple-layered films 214, 224, and 234 and the third ITO layers 215 and 225, respectively. Thus, the third ITO layers 215 and 225 and the fourth ITO layers 216 may be selectively stacked without inhibiting electrical connection between the ITO layers. With this structure of the pixel electrodes 210, 220, and 230, differences in the lifespan of the emission layer 260, i.e., the RGB pixels 260R, 260G, and 260B, on each of the pixel electrodes 210, 220, and 230 may be reduced.

Hereinafter, a fabricating method of an organic light emitting diode display according to an embodiment will be described.

To fabricate an organic light emitting diode display, first, a display substrate 100 made of, e.g., glass or the like, may be prepared. A switching thin film transistor, a driving thin film transistor, a capacitor element, etc. may be formed by stacking and patterning, e.g., various lines, electrodes, insulation layers, etc. (not illustrated), on the display substrate 100. After that, an organic light emitting diode may be formed by forming a pixel electrode so as to be electrically connected to the driving thin film transistor, and forming an organic emission layer and a common electrode on the pixel electrode. In the present embodiment, the pixel electrode may be formed of a transparent electrode; and a reflective layer may be additionally formed on the common electrode to form a bottom emission structure. The common electrode may be formed of a transparent electrode and the reflective layer may be omitted to form a dual emission structure. The organic light emitting diode including the pixel electrode, the organic emission layer, and the common electrode may be formed. Then, an encapsulator, e.g., an encapsulation substrate or a thin film encapsulation layer, may be formed on the organic light emitting diode to seal and protect the organic light emitting diode, thereby fabricating an organic light emitting diode display.

In the present embodiment, each pixel electrode may have a different thickness in order to reduce differences in the lifespan of RGB pixels of each organic emission layer. For example, hydrophobic layers may be formed on the pixel electrodes in order to provide different thicknesses of the pixel electrodes.

FIGS. 4A to 4G illustrate stages in a fabricating process of a pixel electrode of an organic light emitting diode display according to an embodiment. Referring to FIGS. 4A to 4G, a pixel electrode formation process of the fabricating method of the organic light emitting diode display, i.e., a process of forming a hydrophobic layer on a pixel electrode and varying the thicknesses of each pixel electrode, will be described in detail.

Figure 4A:
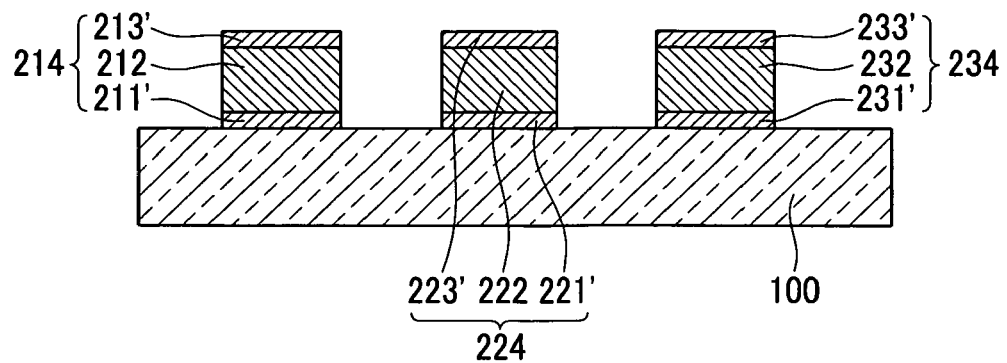
FIGS. 4A to 4G illustrate stages in a fabricating process of a pixel electrode of an organic light emitting diode display according to an embodiment.

Referring to FIG. 4A, ITO layers 211', 221', and 231', Ag layers 212, 222, and 232, and ITO layers 213', 223', and 233' may be sequentially stacked and patterned on the display substrate 100 where, e.g., the driving thin film transistor, etc. (not illustrated), are formed. The layers may be formed using the same mask, and accordingly, the triple-layered films 214, 224, and 234 of ITO/Ag/ITO may be spaced apart from each other. Each of the ITO layers 211', 221', 231', 213', 223', and 233' may include amorphous ITO.

Figure 4B:
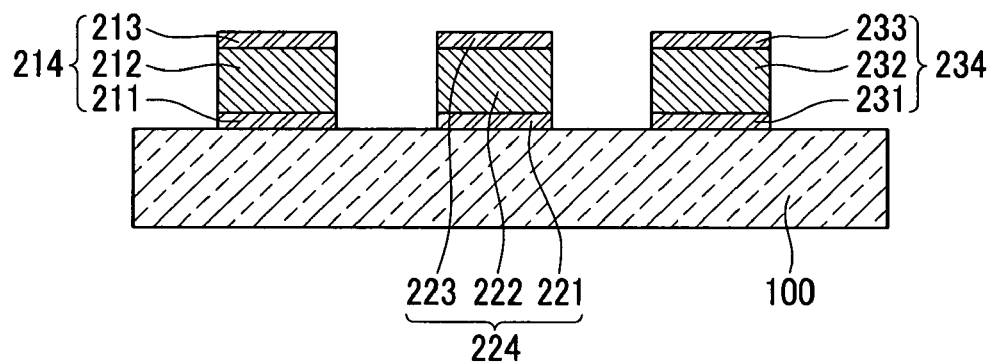

Referring to FIG. 4B, after the triple-layered films 214, 224, and 234 of ITO/Ag/ITO are formed, a heat treatment may be performed. The heat treatment may be performed for about 30 minutes at a temperature higher than about 150° C. By this heat treatment, the amorphous ITO of the ITO layers 211', 221', 231', 213', 223', and 233' may be transformed into polycrystalline ITO, thus forming first ITO layers 211, 221, and 231 and second ITO layers 213, 223, and 233.

Figure 4C:
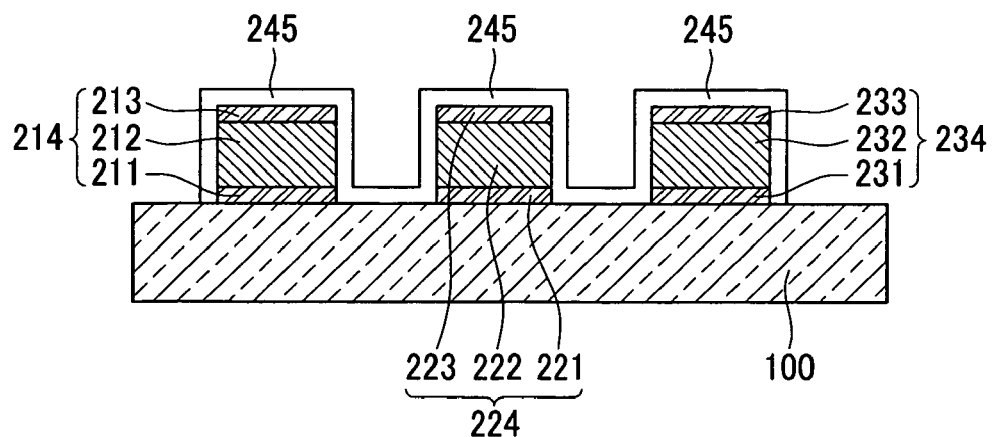

Referring to FIG. 4C, after the first ITO layers 211, 221, and 231 and the second ITO layers 213, 223, and 233 are formed by heat treatment, a first hydrophobic layer 245 may be formed on each of the tripe layers 214, 224, and 234. In the present embodiment, the first hydrophobic layer 245 may be an organic oxide film that is naturally stacked and formed on the triple-layered films 214, 224, and 234 by, e.g., exposing the thermally-treated triple-layered films 214, 224, and 234 to the ambient environment.

In the course of the process, the organic oxide film may be stacked and formed in the ambient environment. This organic oxide film may be formed as a monomolecular layer or a thin film that is thicker than a monomolecular layer, and may include a hydrophobic material that does not dissolve well in water. Thus, the organic oxide film may not be removed by washing during the fabricating process. For example, in the present embodiment, the naturally stacked and formed organic oxide film may be used as the first hydrophobic layer 245 without this washing procedure, so that the pixel electrodes 210, 220, and 230 may have a differential structure as will be described below. The naturally stacked and formed organic oxide film, e.g., the first hydrophobic layer 245, may be formed as a thin film having a thickness of about 30 Å to about 50 Å, so that electrical connection between ITO layers is not blocked by the first hydrophobic layer 245.

While the present embodiment refers to a case in which the first hydrophobic layer 245 is naturally stacked and formed by the ambient environment, the first hydrophobic layer 245 may be artificially formed. Even when the first hydrophobic layer 245 is artificially formed, it may be formed of a thin film to prevent electrical connection from being broken.

Figure 4D:
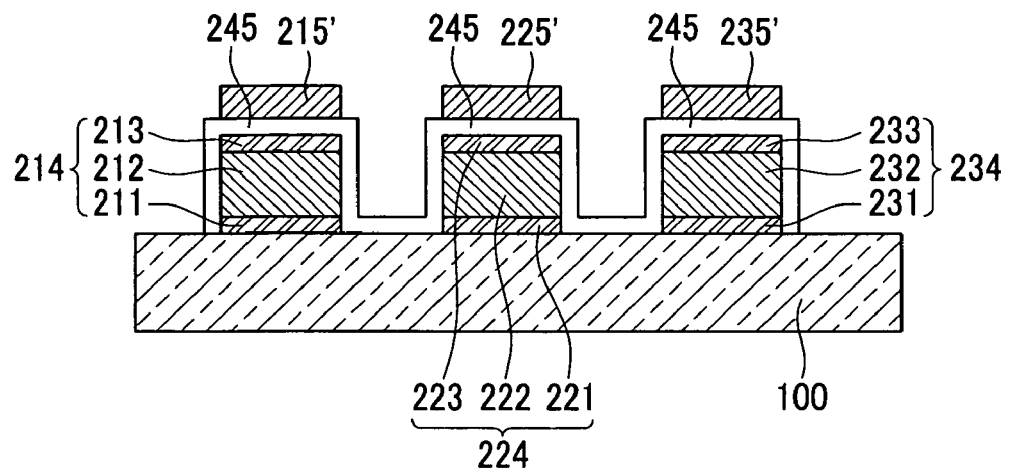

Referring to FIG. 4D, after the first hydrophobic layer 245 is formed, ITO layers 215', 225', and 235' may be respectively formed on the triple-layered films 214, 224, and 234. The ITO layers 215', 225', and 235' may include amorphous ITO, and may be formed using the mask used to form the triple-layered films 214, 224, and 234.

Figure 4E:
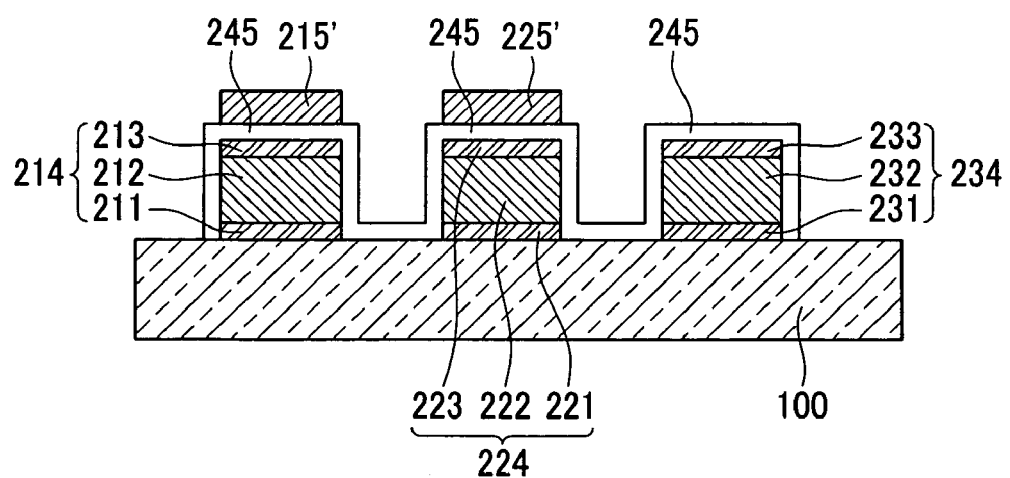

Referring to FIG. 4E, part of the ITO layer 235' may be removed by etching. For example, a photoresist layer (not illustrated) may be formed on the ITO layers 215' and 225'; and then the ITO layer 235' where the photoresist layer is not formed may be selectively removed by using an etchant for selectively etching amorphous ITO. Then, the photoresist layer may be removed. The ITO layers 215' and 225' under the photoresist layer may not be etched because the etchant may not contact them. The second ITO layer 233 of the triple-layered films 234 may be made of polycrystalline ITO by heat treatment. Thus, the second ITO layer 233 may not be etched by the etchant for selectively removing amorphous ITO. The first hydrophobic layer 245 may suppress polycrystallization of the amorphous ITO of the ITO layer 235' by the second ITO layer 233 formed of polycrystalline ITO and may facilitate selective etching.

Figure 4F:
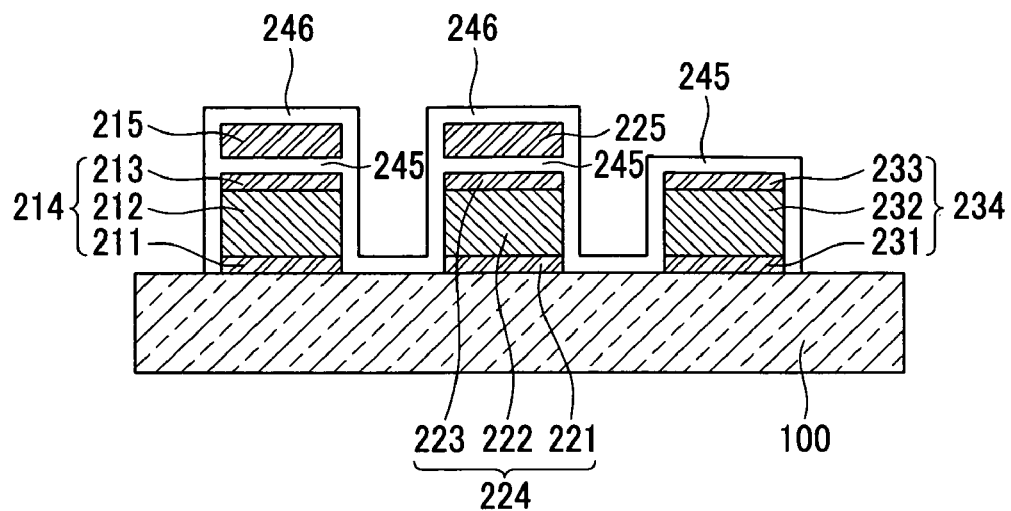

Referring to FIG. 4F, after the part of the ITO layer 235' including amorphous ITO is removed, a heat treatment may be performed. The heat treatment may be performed for about 30 minutes at a temperature higher than about 150° C. By this heat treatment, the amorphous ITO of the ITO layers 215' and 225' may be transformed into polycrystalline ITO, thus forming third ITO layers 215 and 225.

After the heat treatment, a second hydrophobic layer 246 may be formed on the third ITO layers 215 and 225 and the triple-layered film 234. The second hydrophobic layer 246 may be an organic oxide film that is naturally stacked and formed by exposure to the ambient environment. Alternatively, the second hydrophobic layer 246 may be artificially formed. The second hydrophobic layer 245 may be formed as a thin film having a thickness of about 30 Å to about 50 Å to prevent electrical connection from being broken by the second hydrophobic layer 246.

Figure 4G:
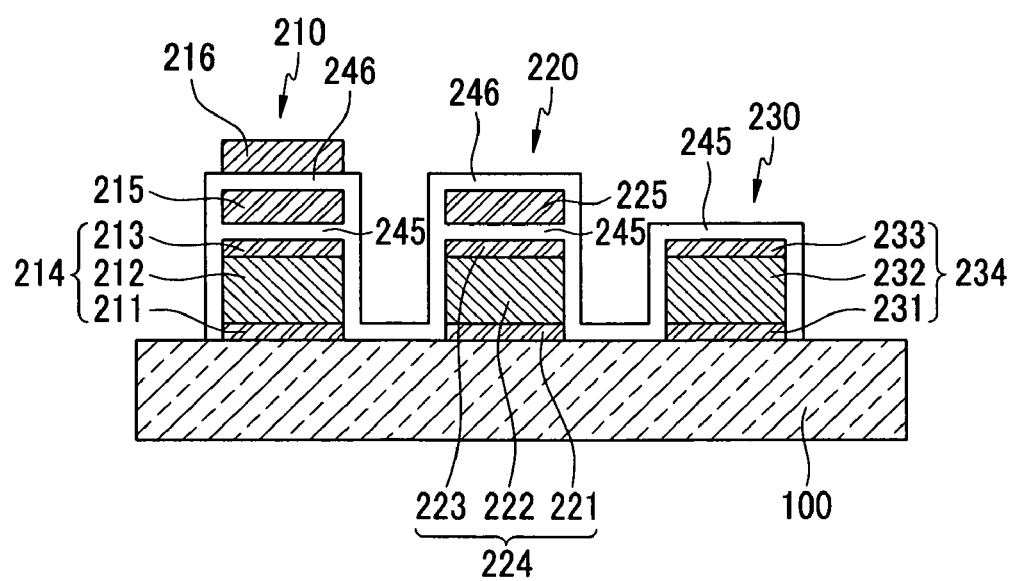

Referring to FIG. 4G, an ITO layer including amorphous ITO may be formed on the second hydrophobic layer 246 by using the same mask as described above. Another selective etching process, similar to that illustrated in FIG. 4E, may be performed, thus forming a fourth ITO layer 216. For example, a photoresist layer (not illustrated) may be formed only on the ITO layer corresponding to the first pixel electrode 210, among the ITO layers including amorphous ITO formed on the triple-layered films 214, 224, 234. Then, the ITO layers where the photoresist layer is not formed may be selectively removed by using an etchant for selectively etching amorphous ITO. Afterwards, the photoresist layer may be removed and the fourth ITO layer 216 may be formed.

Accordingly, the first pixel electrode 210 may include the third ITO layer 215 and the fourth ITO layer 216 on the triple-layered film 214, the second pixel electrode 220 may include the third ITO layer 225 on the triple-layered film 224, and the third pixel electrode 230 may include the triple-layered film 234, thereby making the thicknesses of the pixel electrodes different from each other.

It is possible to provide a differential structure in which thicknesses of the pixel electrodes 210, 220, and 230 are varied by a heat treatment process for polycrystallization of ITO and an etching process for selective etching. By this process, a number of steps of a deposition process using a mask may be decreased, occurrence of defects during the deposition process may be reduced, and production yield may be improved. Moreover, productivity may be improved and manufacturing costs of the organic light emitting diode display may be reduced.

According to the embodiments an additional buffer layer may be unnecessary and the deposition process using an additional mask may thus be unnecessary. Accordingly, manufacturing costs of the organic light emitting diode display may be reduced due to the decrease in the number of deposition masks, defects during the deposition process may be reduced, and production yield may be increased.

The embodiments provide an organic light emitting diode display with reduced occurrence of defects during formation of a pixel electrode of an organic light emitting diode having a differential structure.

The embodiments provide a fabricating method of an organic light emitting diode display, which reduces manufacturing costs and improves productivity by reducing a number of steps of a mask deposition process.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode display, comprising:
   a substrate;
   a thin film transistor on the substrate; and
   an organic light emitting diode on the substrate, the organic light emitting diode including a pixel electrode, an organic emission layer, and a common electrode,
   wherein:
      the organic emission layer includes a red (R) pixel, a green (G) pixel, and a blue (B) pixel,
      the pixel electrode includes a first pixel electrode, a second pixel electrode, and a third pixel electrode that respectively correspond to the red pixel, the green pixel, and the blue pixel,
      the first pixel electrode, the second pixel electrode, and the third pixel electrode each have different thicknesses, and
      the first pixel electrode, the second pixel electrode, and the third pixel electrode each include a first hydrophobic layer.

2. The organic light emitting diode display as claimed in claim 1, wherein:
   a thickness of the first pixel electrode is greater than a thickness of the second pixel electrode, and
   a thickness of the second pixel electrode is greater than a thickness of the third pixel electrode.

3. The organic light emitting diode display as claimed in claim 1, wherein:
   the first pixel electrode includes a sequentially stacked first ITO (indium tin oxide) layer, Ag (silver) layer, second ITO layer, third ITO layer, and fourth ITO layer,
   the first hydrophobic layer is between the second ITO layer and the third ITO layer, and
   the first pixel electrode further includes a second hydrophobic layer, the second hydrophobic layer being between the third ITO layer and the fourth ITO layer.

4. The organic light emitting diode display as claimed in claim 3, wherein the first ITO layer, the second ITO layer, and the third ITO layer each include polycrystalline ITO.

5. The organic light emitting diode display as claimed in claim 1, wherein:
   the second pixel electrode includes a sequentially stacked first ITO layer, Ag layer, second ITO layer, and third ITO layer, and
   the first hydrophobic layer is between the second ITO layer and the third ITO layer.

6. The organic light emitting diode display as claimed in claim 5, wherein the second pixel electrode further includes a second hydrophobic layer, the second hydrophobic layer being on the third ITO layer.

7. The organic light emitting diode display as claimed in claim 5, wherein the first ITO layer, the second ITO layer, and the third ITO layer each include polycrystalline ITO.

8. The organic light emitting diode display as claimed in claim 1, wherein:
   the third pixel electrode includes a sequentially stacked first ITO layer, Ag layer, and second ITO layer, and
   the first hydrophobic layer is on the second ITO layer.

9. The organic light emitting diode display as claimed in claim 8, wherein the first ITO layer and the second ITO layer each include polycrystalline ITO.

10. The organic light emitting diode display as claimed in claim 1, wherein the first hydrophobic layer has a thickness of about 30 Å to about 50 Å.

11. The organic light emitting diode display as claimed in claim 1, wherein the organic emission layer further includes at least one of a hole injection layer, a hole transporting layer, an electron transporting layer, and an electron injection layer.

12. The organic light emitting diode display as claimed in claim 1, further comprising a reflective layer on the common electrode.

* * * * *